United States Patent
Yamamoto et al.

(10) Patent No.: US 11,425,825 B2
(45) Date of Patent: Aug. 23, 2022

(54) SOLDER PASTE USING A SOLDER PASTE FLUX AND SOLDER POWDER

(71) Applicant: KOKI Company Limited, Tokyo (JP)

(72) Inventors: Yuki Yamamoto, Tokyo (JP); Satoshi Ootani, Tokyo (JP); Mitsuyasu Furusawa, Tokyo (JP)

(73) Assignee: KOKI Company Limited, Tokyo (JP)

( * ) Notice: Subject to any disclaimer, the term of this patent is extended or adjusted under 35 U.S.C. 154(b) by 155 days.

(21) Appl. No.: 16/321,873

(22) PCT Filed: Aug. 2, 2017

(86) PCT No.: PCT/JP2017/028007
§ 371 (c)(1),
(2) Date: Jan. 30, 2019

(87) PCT Pub. No.: WO2018/025903
PCT Pub. Date: Feb. 8, 2018

(65) Prior Publication Data
US 2019/0182966 A1      Jun. 13, 2019

(30) Foreign Application Priority Data

Aug. 2, 2016   (JP) .............................. JP2016-152043

(51) Int. Cl.
| | | |
|---|---|---|
| H05K 3/34 | (2006.01) | |
| C22C 9/02 | (2006.01) | |
| C22C 13/00 | (2006.01) | |
| H01B 1/22 | (2006.01) | |
| B23K 35/26 | (2006.01) | |
| B23K 35/30 | (2006.01) | |
| B23K 35/36 | (2006.01) | |
| C22C 13/02 | (2006.01) | |

(52) U.S. Cl.
CPC ........... *H05K 3/3489* (2013.01); *B23K 35/26* (2013.01); *B23K 35/30* (2013.01); *B23K 35/3615* (2013.01); *B23K 35/3618* (2013.01); *C22C 9/02* (2013.01); *C22C 13/00* (2013.01); *H01B 1/22* (2013.01); *C22C 13/02* (2013.01)

(58) Field of Classification Search
CPC ......... H05K 3/3489; B23K 35/26; C22C 9/02
USPC .......................................................... 148/24
See application file for complete search history.

(56) References Cited

U.S. PATENT DOCUMENTS

| | | |
|---|---|---|
| 5,571,340 A | 11/1996 | Schneider et al. |
| 2004/0000355 A1 | 1/2004 | Suga et al. |
| 2010/0025639 A1 | 2/2010 | Ogi et al. |
| 2012/0048426 A1* | 3/2012 | Ishizaki ............... B22F 1/0018 148/24 |
| 2016/0184936 A1 | 6/2016 | Mori et al. |
| 2017/0136585 A1 | 5/2017 | Shimizu |

FOREIGN PATENT DOCUMENTS

| | | |
|---|---|---|
| CN | 101522344 | 9/2009 |
| CN | 105451929 | 3/2016 |
| EP | 2067551 | 6/2009 |
| JP | 10-505006 | 5/1998 |
| JP | 2004-176179 | 6/2004 |
| JP | 2010-149185 | 7/2010 |
| JP | 2014-195825 | 10/2014 |
| TW | 200306900 | 12/2003 |
| TW | 201618627 | 5/2016 |
| WO | 96/07503 | 3/1996 |
| WO | 2016/002741 | 1/2016 |

\* cited by examiner

*Primary Examiner* — Weiping Zhu
(74) *Attorney, Agent, or Firm* — Clark & Brody LP

(57) ABSTRACT

Provided is a flux for solder paste including an organic component as a main component, which is composed of a fatty acid and an aliphatic primary amine.

7 Claims, No Drawings

SOLDER PASTE USING A SOLDER PASTE FLUX AND SOLDER POWDER

CROSS-REFERENCE TO RELATED APPLICATION

This application claims priority to Japanese Patent Application No. 2016-152043, the disclosure of which is incorporated herein by reference in its entirety.

FIELD

The present invention relates to a flux for solder paste and a solder paste that is formed using the flux for solder paste.

BACKGROUND

When a joined structure, in which a joining part such as an electronic component is joined to a substrate, is produced, a solder paste including a solder powder and a flux is applied to an electrode on a surface of the substrate, followed by heating in a state where the electrode is in contact with an electrode of the joining part, so that the substrate and the joining part are joined to each other through a solder joint portion formed by the solder paste.

In recent years, there is a demand to use a solder alloy containing no lead (i.e., a lead-free solder alloy) as a solder alloy for forming a solder powder in a solder paste in consideration of the environment. As the solder powder using the lead-free solder alloy, there has been suggested a mixed product of Sn metal particles composed of Sn or an Sn alloy and Cu metal particles composed of Cu or a Cu alloy (see Patent Literature 1).

When the solder paste using such a solder powder is heated to form a solder joint portion as mentioned above, the Sn metal particles having a melting point lower than that of the Cu metal particles first melt. Then, the molten Sn metal reacts with Cu on the surface of the Cu metal particles to form an intermetallic compound (specifically, CuSn alloy) layer (hereinafter referred to as "an IMC layer") on the surface of the Cu metal particles. Since the IMC layer has a melting point higher than the Sn metal, the solder joint portion is less likely to remelt even when the solder joint portion is reheated. Thus, it is possible to sufficiently maintain a joined state of the solder joint portion, even if the jointed structure must be reheated.

However, when a solder joint portion is formed using a solder paste composed of a mixture of different metal particles respectively having different melt points, as mentioned above, voids (air gaps) easily occur within the solder joint portion. Specifically, when a solder paste such as the one mentioned above is heated, a volatile component such as a flux is volatilized to generate gas to thereby cause the gas metal to remain in the molten Sn metal in the form of air bubbles. The gas is not removed from the Sn metal even during it is solidified and remains therein so that a solder joint portion with voids is formed. Existing of many voids in the solder joint portion may cause reduction in contact area between the substrate and the joining part and hence cause increase in electric resistance, which leads to heat generation or the like.

CITATION LIST

Patent Literature

Patent Literature 1 JP 2010-149185 A

SUMMARY

Technical Problem

It is therefore an object of the present invention to provide a flux for solder paste capable of forming a solder joint portion with less voids, and to provide a solder paste using the flux for solder paste.

Solution to Problem

A flux for solder paste according to the present invention includes, as a main component, an organic component that includes a fatty acid and an aliphatic primary amine.

The aforementioned flux for solder paste preferably includes the organic component with a mass ratio of 70 mass % or more and 100 mass % or less based on the mass of the flux for solder paste.

The aforementioned flux for solder paste preferably includes the fatty acid and the aliphatic primary amine with a molar ratio of 1:0.5 to 1:1.5.

It is preferable that, in the aforementioned flux for solder paste, the fatty acid be at least one of a saturated fatty acid and an unsaturated fatty acid, and the saturated fatty acid have 10 or less carbon atoms in a main chain and the unsaturated fatty acid have 18 or less carbon atoms.

The aforementioned unsaturated fatty acid is preferably at least one selected from the group consisting of oleic acid, linoleic acid, and linolenic acid.

It is preferable that, in the aforementioned flux for solder paste, the fatty acid be composed of a saturated fatty acid and an unsaturated fatty acid, and the ratio of the molar numbers of the unsaturated fatty acid to the total molar numbers of the saturated fatty acid and the unsaturated fatty acid be 20 mol % or less.

It is preferable that, in the aforementioned flux for solder paste, the aliphatic primary amine be at least one of a saturated aliphatic primary amine and an unsaturated aliphatic primary amine, and the saturated aliphatic primary amine have 8 or less carbon atoms in a main chain and the unsaturated aliphatic primary amine have 18 or less carbon atoms.

The aforementioned unsaturated aliphatic primary amine is preferably oleylamine.

A solder paste according to present invention includes a solder powder and any one of the fluxes for solder paste specified above, and the solder powder includes at least one of Sn metal particles composed of Sn or an Sn alloy and Cu metal particles composed of Cu or a Cu alloy.

A content of the flux for solder paste in the aforementioned solder paste is preferably 5 mass % or more and 12 mass % or less.

An average particle size of the solder powder in the aforementioned solder paste is preferably 5 μm or more and 35 μm or less.

DESCRIPTION OF EMBODIMENTS

Hereinafter, embodiments of the present invention will be described. The present invention is not limited to the later-described embodiments.

The flux for solder paste according to the present invention includes, as a main component, an organic component that includes a fatty acid and an aliphatic primary amine. A mass ratio of the organic component based on the mass of the flux for solder paste is preferably 65 mass % or more and 100 mass % or less, more preferably 70 mass % or more and 100 mass % or less. A molar ratio of the fatty acid to the aliphatic primary amine is preferably 1:0.5 to 1:1.5, more preferably 1:0.7 to 1:1.3, particularly preferably 1:1.

As the fatty acid, it is preferable that a fatty acid in the form of a liquid at normal temperature be used. The normal temperature means a temperature of 25° C. or higher and 30° C. or lower. It is also preferable that the fatty acid be not vaporized until it reaches a temperature at which a solder paste is made to reflow. For example, the fatty acid has a boiling point of preferably 140° C. or higher and 400° C. or lower, more preferably 200° C. or higher and 360° C. or lower, particularly preferably 230° C. or higher and 270° C. or lower.

The fatty acid is preferably at least one of a saturated fatty acid and an unsaturated fatty acid. The saturated fatty acid is not specifically limited and has preferably 10 or less, more preferably 9 or less carbon atoms in a main chain, for example. Specifically, examples of the saturated fatty acid include at least one selected from the group consisting of octanoic acid, nonanoic acid, decanoic acid, 4-methyl-nonanoic acid, and 2-hexyldecanoic acid. The unsaturated fatty acid is not specifically limited and has preferably 24 or less carbon atoms, more preferably 18 or less carbon atoms, for example. Specifically, examples of the unsaturated fatty acid include at least one selected from the group consisting of oleic acid, linoleic acid, and linolenic acid.

When a saturated fatty acid and an unsaturated fatty acid are used as the fatty acid, the ratio of the molar numbers of the unsaturated fatty acid to the total molar numbers of the saturated fatty acid and the unsaturated fatty acid is preferably 20 mol % or less, more preferably 10 mol % or less.

As the aliphatic primary amine, it is preferable to use an aliphatic primary amine which is liquid at ordinary temperature. A boiling point of the aliphatic primary amine is preferably 70° C. or higher and 400° C. or lower, more preferably 75° C. or higher and 180° C. or lower. It is also preferable that the aliphatic primary amine have a boiling point lower than that of the fatty acid.

The aliphatic primary amine is preferably at least one of a saturated aliphatic primary amine and an unsaturated aliphatic primary amine. The saturated aliphatic primary amine is not specifically limited and preferably has 8 or less, more preferably 6 or less carbon atoms in a main chain, for example. Examples of the saturated aliphatic primary amine include at least one selected from the group consisting of butylamine, hexylamine, octylamine, and 2-ethylhexylamine. The unsaturated aliphatic primary amine is not specifically limited and preferably has 18 or less carbon atoms, for example. Examples of the unsaturated aliphatic primary amine include oleylamine.

In the aforementioned flux for solder paste, components other than the aforementioned fatty acid and aliphatic primary amine may be included. For example, a solvent, a thixotropic agent or the like may be included for the purpose of adjustment of the viscosity or the like.

The solvent is not specifically limited, and examples thereof include: glycol ethers such as diethylene glycol monohexyl ether (hexyl diglycol), diethylene glycol dibutyl ether (dibutyl diglycol), diethylene glycol mono 2-ethylhexyl ether (2 ethylhexyl diglycol), and diethylene glycol monobutyl ether (butyl diglycol); aliphatic compounds such as n-hexane, isohexane, and n-heptane; esters such as isopropyl acetate, methyl propionate, and ethyl propionate; ketones such as methyl ethyl ketone, methyl-n-propyl ketone, and diethyl ketone; alcohols such as ethanol, n-propanol, isopropanol, isobutanol, and octanediol; and terpene alcohols such as terpineol, menthol, phenylethanol, linalool, and geraniol. The solvent can be used alone, or a mixture of a plurality of types thereof may be used. The amount of the solvent to be used is not specifically limited and is preferably 0 mass % or more and 20 mass % or less, more preferably 0 mass % or more and 16 mass % or less, based on the mass of the flux for solder paste, for example.

The thixotropic agent is not specifically limited, and examples thereof include higher fatty acid amide such as amide-based thixotropic agents, hydrogenated castor oil, beeswax, carnauba wax, and stearic acid amide. The amount of the thixotropic agent to be used is not specifically limited and is preferably 0 mass % or more and 20 mass % or less, more preferably 0 mass % or more and 16 mass % or less, based on the mass of the flux for solder paste, for example.

The aforementioned flux for solder paste is kneaded with a solder powder to form a solder paste. The mass ratio of the flux for solder paste based on the solder paste is not specifically limited and is preferably 5 mass % or more and 12 mass % or less, more preferably 5.5 mass % or more and 8 mass % or less, and still more preferably 5.5 mass % or more and 6 mass % or less, for example.

The viscosity of the solder paste is not specifically limited and can be adjusted depending on the supplying method such as the printing and the dispensing coating. For example, the viscosity is preferably 10 Pa·s or more and 350 Pa·s or less, more preferably 100 Pa·s or more and 300 Pa·s or less. The viscosity is measured based on the viscosity value at 10 rpm using the spiral viscometer (PCU-205 manufactured by Malcom Co., Ltd.).

The solder powder is not specifically limited and a generally available solder powder can be used. For example, metal powder, which forms lead-free solders such as Sn—Ag solders, Sn—Ag—Cu solders, Sn—Ag—Cu—Bi solders, Sn—Ag—In—Bi solders, Sn—Cu solders, Sn—Zn solders, Sn—Bi solders, Sn—Sb solders, Sn—Au solders, and Sn—In solders, which are used as lead-free solders can be used therefor. In particular, a mixed product of Sn metal particles composed of Sn or an Sn alloy and Cu metal particles composed of Cu or a Cu alloy (hereinafter also referred to as an SnCu solder powder) is preferably used as the solder powder.

Examples of the Sn metal particles include Sn particles composed of 100 mass % of Sn, or Sn alloy particles composed of Sn and one or more metals selected from the group consisting of In, Ag, Cu, Sb, Ni, Ge, Fe, Co, and Bi. Examples of the Sn alloy particles preferably include Sn alloy particles having a composition of Sn—Ag, Sn—Cu, Sn—Sb, or Sn—Ag—Cu.

The Sn metal particles have an average particle size D50 (median size) of preferably 1 μm or more and 70 μm or less, more preferably 5 μm or more and 35 μm or less, for example. Further, a 90% particle size D90 of the Sn metal particles is preferably 100 μm or less, more preferably 60 μm or less. With the Sn metal particles having a particle size within the aforementioned range, thin printing with a thickness of 60 μm or less becomes possible so that the solder joint portion can be formed to have a thin thickness. When the solder joint portion has a thinner thickness, heat radiation performance can be improved.

Examples of the Cu metal particles include Cu particles composed of 100 mass % of Cu, or Cu alloy particles composed of Cu and one or more metals selected from the group consisting of In, Ag, Sn, and Bi. Examples of the Cu alloy particles preferably include Cu alloy particles having a composition of Cu—Ag—Sn—Bi—In.

An average particle size D50 (median size) of the Cu metal particles is preferably 1 μm or more and 70 μm or less, more preferably 5 µm or more and 35 µm or less, for example. Further, a 90% particle size D90 of the Cu metal particles is preferably 100 µm or less, more preferably 60 µm or less. With the Cu metal particles having a particle size within the aforementioned range, thin printing with a thickness of 60 µm or less becomes possible so that the solder joint portion can be formed to have a thin thickness. When the solder joint portion has a thinner thickness, heat radiation performance can be improved.

The aforementioned "average particle size D50 (median size)" and "90% particle size D90" mean values measured by the laser diffraction particle size distribution measuring device.

The mixing ratio of the Sn metal particles and the Cu metal particles is not specifically limited. For example, the ratio of the Sn metal particles is preferably 35 mass % or more and 85 mass % or less, more preferably 50 mass % or more and 65 mass % or less. The ratio of the Cu metal particles is preferably 15 mass % or more and 65 mass % or less, more preferably 35 mass % or more and 50 mass % or less. With such a mixing ratio, when the solder paste is heated, molten Sn metal reacts with Cu on the surface of the Cu metal particles to sufficiently form intermetallic (specifically, a CnSn alloy) layer (hereinafter also referred to as an IMC layer) on the surface of the Cu metal particles.

Other metal particles may be included in addition to Sn metal particles and Cu metal particles as the metal particles constituting the aforementioned solder power. Examples of the other metal particles include metal particles including Ni or the like. The content of the other metal particles is preferably 1 mass % or more and 20 mass % or less based on the mass of the solder powder.

As described above, a solder joint portion with less voids can be formed by the flux for solder paste and the solder paste according to the present invention.

That is, it is possible to suppress or reduce occurrence of voids in the solder joint portion caused when the joining part such as an electronic component is joined to a substrate using the solder paste formed by kneading the flux for solder paste containing, as a main component, an organic component, which includes a fatty acid and an aliphatic primary amine, with a solder powder.

The flux for solder paste and the solder paste according to the present invention are not limited to the aforementioned embodiments, and various modifications can be made without departing from the gist of the present invention. Further, it is of course that the configurations, methods, or the like, of the above-described plurality of embodiments may be optionally employed and combined (configuration, method, or the like, of one embodiment may be applied to configuration, method, or the like, of another embodiment).

EXAMPLES

Hereinafter, examples of the present invention will be described. However, the present invention is not limited to the following examples.
<Used Materials>
1. Fatty Acid
Octanoic acid (product name: N-Octanoic Acid, manufactured by Tokyo Chemical Industry Co., Ltd.)

Nonanoic acid (product name: Nonanoic Acid, manufactured by Tokyo Chemical Industry Co., Ltd.)
4-methylnonanoic acid (product name: 4-Methylnonanoic Acid, manufactured by Tokyo Chemical Industry Co., Ltd.)
Decanoic acid (product name: Decanoic Acid, manufactured by Tokyo Chemical Industry Co., Ltd.)
Stearic acid (product name: Stearic Acid, manufactured by Tokyo Chemical Industry Co., Ltd.)
Oleic acid (product name: Oleic Acid, manufactured by Wako Pure Chemical Industries, Ltd.)
Linoleic acid (product name: Linoleic Acid, manufactured by Sigma-Aldrich Co. LLC)
Linolenic acid (product name: Linolenic Acid, manufactured by Tokyo Chemical Industry Co., Ltd.)
2-hexyldecanoic acid (product name: 2-hexyldecanoic acid, manufactured by Tokyo Chemical Industry Co., Ltd.)
2. Aliphatic Primary Amine
Butylamine (product name: Butylamine, manufactured by Tokyo Chemical Industry Co., Ltd.)
Hexylamine (product name: Hexylamine, manufactured by Tokyo Chemical Industry Co., Ltd.)
2-ethylhexylamine (product name: 2-Ethylhexylamine, manufactured by Koei Chemical Company, Limited)
Octylamine (product name: N-Octylamine, manufactured by Tokyo Chemical Industry Co., Ltd.)
Oleylamine (product name: Oleylamine, manufactured by Tokyo Chemical Industry Co., Ltd.)
3. Resin Component
Ultra-pale rosin (product name: KR-612, manufactured by Arakawa Chemical Industries, Ltd.)
Disproportionated rosin (product name: RONDIS R, manufactured by Arakawa Chemical Industries, Ltd.)
4. Solvent
Hexyl diglycol (product name: HeDG, manufactured by Nippon Nyukazai Co., Ltd.)
Terpineol (product name: Terpineol, manufactured by Yasuhara Chemical Co., Ltd.)
5. Thixotropic Agent
N,N'-hexamethylene-bis-12-Hydroxy stearyl amide (product name: J-630, manufactured by Itoh Oil Chemicals Co., Ltd.)
Hydrogenated castor oil (product name: Hydrogenated Castor Oil, manufactured by Itoh Oil Chemicals Co., Ltd.)
Honey wax (product name: Red Brand Bleached Bee's Wax, manufactured by Miki Chemical Industry & Co., Ltd.)
6. Activator
Adipic acid (product name: Adipic Acid, manufactured by Tokyo Chemical Industry Co., Ltd.)
Trans-2,3-dibromo-2-butene-1,4-diol (Product name: DBBD, manufactured by JAIN SPECIALITY FINE CHEMICALS)
7. Solder Powder 1
A solder powder formed of Sn metal particles composed of Sn (average particle size: 19.8 µm) and Cu metal particles composed of a Cu alloy (average particle size: 11.7 µm) was used. The Cu alloy included 65 mass % of Cu, 15 mass % of Sn, 10 mass % of Ag, 5 mass % of Bi, and 5 mass % of In. The mass ratio of each of the particles based on the mass of the solder powder was: 65 mass % of the Sn metal particles and 35 mass % of the Cu metal particles. The aforementioned average particle size (D50) was measured by the laser diffraction particle size distribution measuring device manufactured by Beckman Coulter, Inc.

8. Solder Powder 2

A solder powder formed of first Sn metal particles composed of Sn (average particle size: 19.8 μm), second Sn metal particles composed of an Sn alloy (average particle size: 30.8 pin), and Cu metal particles composed of a Cu alloy (average particle size: 11.7 μm) was used. The Sn alloy included 95 mass % of Sn and 5 mass % of Sb. The Cu alloy included 65 mass % of Cu, 15 mass % of Sn, 10 mass % of Ag, 5 mass % of Bi, and 5 mass % of In. The mass ratio of each of the particles based on the mass of the solder powder was: 32.5 mass % of the first Sn metal particles, 32.5 mass % of the second Sn metal particles, and 35 mass % of the Cu metal particles. The aforementioned average particle size (D50) was measured by the laser diffraction particle size distribution measuring device manufactured by Beckman Coulter, Inc.

9. Solder Powder 3

A solder powder formed of first Sn metal particles composed of Sn (average particle size: 19.8 μm), second Sn metal particles composed of an Sn alloy (average particle size: 28 μm), and Cu metal particles composed of a Cu alloy (average particle size: 11.7 μm) was used. The Sn alloy included 1.1 mass % of Ag, 0.7 mass % of Cu, 0.07 mass % of Ni, 0.01 mass % of Ge, and the remainder of Sn only. The mass ratio of each of the particles based on the mass of the solder powder was: 32.5 mass % of the first Sn metal particles, 32.5 mass % of the second Sn metal particles, and 35 mass % of the Cu metal particles. The aforementioned average particle size (D50) was measured by the laser diffraction particle size distribution measuring device manufactured by Beckman Coulter, Inc.

10. Solder Powder 4

A solder powder formed of Sn metal particles composed of Sn (average particle size: 19.8 μm) and Cu metal particles composed of a Cu alloy (average particle size: 1.1 μm) was used. The mass ratio of each of the particles based on the mass of the solder powder was: 65 mass % of the Sn metal particles and 35 mass % of the Cu metal particles. The aforementioned average particle size (D50) was measured by the laser diffraction particle size distribution measuring device manufactured by Beckman Coulter, Inc.

11. Solder Powder 5

A solder powder formed of Sn metal particles composed of Sn (average particle size: 19.8 μm) and Cu metal particles composed of a Cu alloy (average particle size: 11.7 μm) was used. The Cu alloy included 65 mass % of Cu, 15 mass % of Sn, 10 mass % of Ag, 5 mass % of Bi, and 5 mass % of In. The mass ratio of each of the particles based on the mass of the solder powder was: 50 mass % of the Sn metal particles and 50 mass % of the Cu metal particles. The aforementioned average particle size (D50) was measured by the laser diffraction particle size distribution measuring device manufactured by Beckman Coulter, Inc.

12. Solder Powder 6

A solder powder formed of Sn metal particles composed of Sn (average particle size: 19.8 μm) and Cu metal particles composed of a Cu alloy (average particle size: 11.7 μm) was used. The Cu alloy included 65 mass % of Cu, 15 mass % of Sn, 10 mass % of Ag, 5 mass % of Bi, and 5 mass % of In. The mass ratio of each of the particles based on the mass of the solder powder was: 40 mass % of the Sn metal particles and 60 mass % of the Cu metal particles. The aforementioned average particle size (D50) was measured by the laser diffraction particle size distribution measuring device manufactured by Beckman Coulter, Inc.

13. Solder Powder 7

A solder powder formed of Sn metal particles composed of Sn (average particle size: 7.3 μm) and Cu metal particles composed of a Cu alloy (average particle size: 9.6 μm) was used. The Cu alloy included 65 mass % of Cu, 15 mass % of Sn, 10 mass % of Ag, 5 mass % of Bi, and 5 mass % of In. The mass ratio of each of the particles based on the mass of the solder powder was: 65 mass % of the Sn metal particles and 35 mass % of the Cu metal particles. The aforementioned average particle size (D50) was measured by the laser diffraction particle size distribution measuring device manufactured by Beckman Coulter, Inc.

14. Solder Powder 8

A solder powder formed of Sn metal particles composed of an Sn alloy (average particle size: 28.8 μm) was used. The Sn alloy included 96.5 mass % of Sn, 3.0 mass % of Ag, and 0.5 mass % of Cu. The aforementioned average particle size (D50) was measured by the laser diffraction particle size distribution measuring device manufactured by Beckman Coulter, Inc.

Comparative Example 1

1. Production of Flux

A flux (Comparative Example 1) was produced by kneading the aforementioned resin components, activators, thixotropic agents, and solvents according to the formulation shown in Table 1 below.

TABLE 1

| | Flux formulation (mass %) | | | |
|---|---|---|---|---|
| | Resin component | Activator | Thixotropic agent | Solvent |
| Com. Ex. 1 | KR-612 (20 mass %) RONDIS R (20 mass %) | Adipic acid (1 mass %) DBBD (1 mass %) | J-630 (10 mass %) Hydrogenated castor oil (2 mass %) | HeDG (46 mass %) |

2. Production of Solder Paste

A solder paste was produced by kneading the flux of Comparative Example 1 and the aforementioned solder powder 1 according to the formulation shown in Table 2 below.

TABLE 2

| | Flux of Comparative Example 1 | Solder powder 1 |
|---|---|---|
| Solder paste formulation (mass %) | 11 | 89 |

3. Evaluation of Voids
(1) Production of Pseudo Substrate

A pseudo substrate was produced by printing the solder paste of Comparative Example 1 on a Cu plate (that was subjected to an ammonium persulfate etching treatment) to have a thickness of 60 μm and a mask opening rate of 100%.

(2) Heat Treatment

The obtained pseudo substrate was subjected to a heat treatment using the high temperature observation equipment (SK-5000, manufactured by SANYOSEIKO CO., Ltd.). The heat treatment was performed under the temperature conditions of raising the temperature from the start of heat treatment (normal temperature) to 120° C. at 1.6° C./second, then maintaining at 120° C. for 300 seconds, and cooling from 120° C. to the normal temperature at 0.8° C./second (temperature profile 1). The heat treatment was performed under a nitrogen atmosphere with an oxygen concentration of 500 ppm or lower. Another heat treatment was performed under the temperature conditions different from the temperature profile 1 in a state where a pressure of 0.4 MPa was applied on an Si chip (size: 0.3×5.0×5.0) that was stacked on a solder paste of the pseudo substrate after the heat treatment with the temperature profile 1. Thereby, a test body was obtained. The heat treatment was performed under temperature conditions of raising the temperature from the start of heat treatment (normal temperature) to 150° C. at 2.1° C./second, raising the temperature from 150° C. to 180° C. at 0.25° C./second, raising the temperature from 180° C. to 250° C. at 2° C./second, then maintaining at 250° C. for 60 seconds, and cooling from 250° C. to the normal temperature at 3.8° C./second (temperature profile 2).

(3) Calculation of Void Rate

The obtained test body was cut at the position where the Si chip was provided so that the cross-sectional surface was observed to calculate a void rate (air-gap rate). Specifically, the area of void portions was calculated using the digital microscope KH-8700 manufactured by HIROX Co., Ltd. and the value was subtracted from the total area of the joint portion, to calculate the void rate. The calculated void rate is shown in Table 3 below.

TABLE 3

|  | Void rate |
| --- | --- |
| Com. Ex. 1 | 61.6% |

Test 1 (Examples 1 to 24)

1. Production of Flux

Fluxes were produced by using the respective fatty acids and the respective aliphatic primary amines by combination according to the formulation shown in Table 4 below and kneading them according to the formulation shown in Table 5 below.

TABLE 4

| | | Flux | | | | | |
| --- | --- | --- | --- | --- | --- | --- | --- |
| | | Fatty acid | | | | | |
| | | Octanoic acid | Nonanoic acid | Decanoic acid | Oleic acid | Linoleic acid | Linolenic acid |
| Aliphatic primary amine | Butylamine | Ex. 1 | Ex. 5 | Ex. 9 | Ex. 13 | Ex. 17 | Ex. 21 |
| | Hexylamine | Ex. 2 | Ex. 6 | Ex. 10 | Ex. 14 | Ex. 18 | Ex. 22 |
| | Octylamine | Ex. 3 | Ex. 7 | Ex. 11 | Ex. 15 | Ex. 19 | Ex. 23 |
| | Oleylamine | Ex. 4 | Ex. 8 | Ex. 12 | Ex. 16 | Ex. 20 | Ex. 24 |

TABLE 5

| | Flux formulation (molar ratio) | |
| --- | --- | --- |
| | Fatty acid | Aliphatic primary amine |
| Examples 1-24 | 1 | 1 |

2. Production of Solder Paste

Solder paste were produced by kneading the respective fluxes of the aforementioned Examples 1 to 24 and the aforementioned solder powder according to the formulation shown in Table 6 below.

TABLE 6

| | Fluxes of Examples 1-24 | Solder powder 1 |
| --- | --- | --- |
| Solder paste formulation (mass %) | 5.5 | 94.5 |

3. Evaluation of Voids

Voids were evaluated under the same conditions as those for Comparative Example 1 except that the test bodies were produced using the respective solder powder pastes produced as described above. The void rate of each of Examples is shown in Table 7 and 8 below.

TABLE 7

| | Flux | | Void rate (%) |
| --- | --- | --- | --- |
| | Fatty acid (Carbon number) (B.P.) | Aliphatic primary amine (Carbon number) (B.P.) | |
| Example 1 | Octanoic acid C8 240° C. | Butylamine C4 78° C. | 14.1 |
| Example 2 | Octanoic acid C8 240° C. | Hexylamine C6 130° C. | 21.6 |
| Example 3 | Octanoic acid C8 240° C. | Octylamine C8 176° C. | 6.0 |
| Example 4 | Octanoic acid C8 240° C. | Oleylamine C18 350° C. | 23.7 |
| Example 5 | Nonanoic acid C9 254° C. | Butylamine C4 78° C. | 29.3 |
| Example 6 | Nonanoic acid C9 254° C. | Hexylamine C6 130° C. | 4.8 |
| Example 7 | Nonanoic acid C9 254° C. | Octylamine C8 176° C. | 3.9 |
| Example 8 | Nonanoic acid C9 254° C. | Oleylamine C18 350° C. | 10.9 |
| Example 9 | Decanoic acid C10 270° C. | Butylamine C4 78° C. | 12.8 |
| Example 10 | Decanoic acid C10 270° C. | Hexylamine C6 130° C. | 9.1 |

TABLE 7-continued

| | Flux | | |
|---|---|---|---|
| | Fatty acid (Carbon number) (B.P.) | Aliphatic primary amine (Carbon number) (B.P.) | Void rate (%) |
| Example 11 | Decanoic acid C10 270° C. | Octylamine C8 176° C. | 11.7 |
| Example 12 | Decanoic acid C10 270° C. | Oleylamine C18 350° C. | 24.5 |

TABLE 8

| | Flux | | |
|---|---|---|---|
| | Fatty acid (Carbon number) (B.P.) | Aliphatic primary amine (Carbon number) (B.P.) | Void rate (%) |
| Example 13 | Oleic acid C18 360° C. | Butylamine C4 78° C. | 40.3 |
| Example 14 | Oleic acid C18 360° C. | Hexylamine C6 130° C. | 23.5 |
| Example 15 | Oleic acid C18 360° C. | Octylamine C8 176° C. | 30.4 |
| Example 16 | Oleic acid C18 360° C. | Oleylamine C18 350° C. | 42.7 |
| Example 17 | Linoleic acid C18 230° C. | Butylamine C4 78° C. | 33.4 |
| Example 18 | Linoleic acid C18 230° C. | Hexylamine C6 130° C. | 22.0 |
| Example 19 | Linoleic acid C18 230° C. | Octylamine C8 176° C. | 35.5 |
| Example 20 | Linoleic acid C18 230° C. | Oleylamine C18 350° C. | 26.4 |
| Example 21 | Linolenic acid C18 232° C. | Butylamine C4 78° C. | 19.2 |
| Example 22 | Linolenic acid C18 232° C. | Hexylamine C6 130° C. | 23.1 |
| Example 23 | Linolenic acid C18 232° C. | Octylamine C8 176° C. | 32.6 |
| Example 24 | Linolenic acid C18 232° C. | Oleylamine C18 350° C. | 31.1 |

Test 2 (Examples 25 to 48)

1. Production of Flux

Fluxes were produced in the same manner as in Test 1 except that the respective fatty acids and the respective aliphatic primary amines were used in combination according to Table 9 below.

TABLE 9

| | | Flux | | | | | |
|---|---|---|---|---|---|---|---|
| | | Fatty acid (mol %) | | | | | |
| | | Octanoic acid (95) Oleic acid (5) | Nonanoic acid (95) Oleic acid (5) | Decanoic acid (95) Oleic acid (5) | Nonanoic acid (95) Linoleic acid (5) | Nonanoic acid (95) Linolenic acid (5) | Nonanoic acid (95) Stearic acid (5) |
| Aliphatic primary amine | Butylamine | Ex. 25 | Ex. 29 | Ex. 33 | Ex. 37 | Ex. 41 | Ex. 45 |
| | Hexylamine | Ex. 26 | Ex. 30 | Ex. 34 | Ex. 38 | Ex. 42 | Ex. 46 |
| | Octylamine | Ex. 27 | Ex. 31 | Ex. 35 | Ex. 39 | Ex. 43 | Ex. 47 |
| | Oleylamine | Ex. 28 | Ex. 32 | Ex. 36 | Ex. 40 | Ex. 44 | Ex. 48 |

2. Production of Solder Paste and Evaluation of Voids

Solder pastes were produced in the same manner as in Test 1 except that the respective fluxes of the aforementioned Examples 25 to 48 were used. Voids were evaluated under the same conditions as those for Comparative Example 1 except that the test bodies were produced using the respective solder pastes produced as described above. The void rate of each of Examples is shown in Tables 10 and 11 below.

TABLE 10

| | Flux | | | |
|---|---|---|---|---|
| | Fatty acid (Carbon number) (B.P.) | | Aliphatic primary amine (Carbon number) (B.P.) | Void rate (%) |
| Example 25 | Octanoic acid C8 240° C. | Oleic acid C18 360° C. | Butylamine C4 78° C. | 17.3 |
| Example 26 | Octanoic acid C8 240° C. | Oleic acid C18 360° C. | Hexylamine C6 130° C. | 4.1 |
| Example 27 | Octanoic acid C8 240° C. | Oleic acid C18 360° C. | Octylamine C8 176° C. | 7.1 |
| Example 28 | Octanoic acid C8 240° C. | Oleic acid C18 360° C. | Oleylamine C18 350° C. | 21.3 |
| Example 29 | Nonanoic acid C9 254° C. | Oleic acid C18 360° C. | Butylamine C4 78° C. | 9.6 |
| Example 30 | Nonanoic acid C9 254° C. | Oleic acid C18 360° C. | Hexylamine C6 130° C. | 2.5 |
| Example 31 | Nonanoic acid C9 254° C. | Oleic acid C18 360° C. | Octylamine C8 176° C. | 17.1 |
| Example 32 | Nonanoic acid C9 254° C. | Oleic acid C18 360° C. | Oleylamine C18 350° C. | 13.8 |
| Example 33 | Decanoic acid C10 270° C. | Oleic acid C18 360° C. | Butylamine C4 78° C. | 5.0 |
| Example 34 | Decanoic acid C10 270° C. | Oleic acid C18 360° C. | Hexylamine C6 130° C. | 8.1 |
| Example 35 | Decanoic acid C10 270° C. | Oleic acid C18 360° C. | Octylamine C8 176° C. | 22.2 |
| Example 36 | Decanoic acid C10 270° C. | Oleic acid C18 360° C. | Oleylamine C18 350° C. | 32.2 |

TABLE 11

| | Flux | | | |
|---|---|---|---|---|
| | Fatty acid (Carbon number) (B.P.) | | Aliphatic primary amine (Carbon number) (B.P.) | Void rate (%) |
| Example 37 | Nonanoic acid C9 254° C. | Linoleic acid C18 230° C. | Butylamine C4 78° C. | 15.4 |

TABLE 11-continued

| | Flux | | | |
|---|---|---|---|---|
| | Fatty acid (Carbon number) (B.P.) | | Aliphatic primary amine (Carbon number) (B.P.) | | Void rate (%) |
| Example 38 | Nonanoic acid C9 254° C. | Linoleic acid C18 280° C. | Hexylamine C6 130° C. | | 5.1 |
| Example 39 | Nonanoic acid C9 254° C. | Linoleic acid C18 230° C. | Octylamine C8 176° C. | | 17.7 |
| Example 40 | Nonanoic acid C9 254° C. | Linoleic acid C18 230° C. | Oleylamine C18 350° C. | | 27.0 |
| Example 41 | Nonanoic acid C9 254° C. | Linolenic acid C18 232° C. | Butylamine C4 78° C. | | 18.0 |
| Example 42 | Nonanoic acid C9 254° C. | Linolenic acid C18 232° C. | Hexylamine C6 130° C. | | 13.9 |
| Example 43 | Nonanoic acid C9 254° C. | Linolenic acid C18 232° C. | Octylamine C8 176° C. | | 17.2 |
| Example 44 | Nonanoic acid C9 254° C. | Linolenic acid C18 232° C. | Oleylamine C18 350° C. | | 28.9 |
| Example 45 | Nonanoic acid C9 254° C. | Stearic acid C18 361° C. | Butylamine C4 78° C. | | 13.2 |
| Example 46 | Nonanoic acid C9 254° C. | Stearic acid C18 361° C. | Hexylamine C6 130° C. | | 10.6 |
| Example 47 | Nonanoic acid C9 254° C. | Stearic acid C18 361° C. | Octylamine C8 176° C. | | 11.2 |
| Example 48 | Nonanoic acid C9 254° C. | Stearic acid C18 361° C. | Oleylamine C18 350° C. | | 27.0 |

Test 3 (Examples 49 to 55)

1. Production of Flux

Fluxes were produced in the same manner as in Test 1 except that the fatty acid and the aliphatic primary amine were used in combination according to Table 12 below to have a molar ratio of the fatty acid according to Table 12 below.

2. Production of Solder Paste and Evaluation of Voids

Solder pastes were produced in the same manner as in Test 1 except that the respective fluxes of the aforementioned Examples 49 to 55 were used. Voids were evaluated under the same conditions as those for Comparative Example 1 except that the test bodies were produced using the solder pastes produced as described above. The void rate of each of Examples is shown in Table 12 below.

TABLE 12

| | Flux | | | |
|---|---|---|---|---|
| | Fatty acid (mol %) | | Aliphatic primary amine (mol %) | Void rate (%) |
| | Nonanoic acid | Oleic acid | Hexylamine | |
| Example 49 | 97 | 3 | 100 | 3.7 |
| Example 50 | 95 | 5 | 100 | 2.5 |
| Example 51 | 90 | 10 | 100 | 6.6 |
| Example 52 | 80 | 20 | 100 | 13.4 |
| Example 53 | 70 | 30 | 100 | 16.1 |
| Example 54 | 60 | 40 | 100 | 27.2 |
| Example 55 | 50 | 50 | 100 | 21.7 |

Test 4 (Examples 56 to 60)

1. Production of Flux and Solder Paste

Solder pastes were produced in the same manner as in Test 1 except that a flux of Example 30 in Test 2 was produced and the flux was used to have a formulation according to Table 13 below.

2. Evaluation of Voids

Voids were evaluated under the same conditions as those for Comparative Example 1 except that the test bodies were produced using the respective solder pastes produced as described above. The void rate of each of Examples is shown in Table 13 below.

TABLE 13

| | Flux paste formulation (mass %) | | Void rate (%) |
|---|---|---|---|
| | Flux of Example 30 | Solder powder 1 | |
| Example 56 | 5.0 | 95.0 | 4.3 |
| Example 57 | 5.5 | 94.5 | 2.5 |
| Example 58 | 6.0 | 94.0 | 2.7 |
| Example 59 | 8.0 | 92.0 | 9.9 |
| Example 60 | 12.0 | 88.0 | 13.5 |

Test 5 (Examples 61 to 67)

1. Production of Flux and Solder Paste

Solder pastes were produced in the same manner as in Test 1 except that the fluxes of Examples 26 and 30 in Test 2 were produced, and the flux and the respective solder powders 2 to 7 were used according to Table 14 below.

2. Evaluation of Voids

Voids were evaluated under the same conditions as those for Comparative Example 1 except that the test bodies were produced using the respective solder pastes produced as described above. The void rate of each of Examples is shown in Table 14 below.

TABLE 14

| | Flux | Solder powder | Void rate (%) |
|---|---|---|---|
| Example 61 | Flux of Example 30 | Solder powder 2 | 6.6 |
| Example 62 | Flux of Example 30 | Solder powder 3 | 6.1 |
| Example 63 | Flux of Example 26 | Solder powder 4 | 29.4 |
| Example 64 | Flux of Example 30 | Solder powder 4 | 16.8 |
| Example 65 | Flux of Example 30 | Solder powder 5 | 6.6 |
| Example 66 | Flux of Example 30 | Solder powder 6 | 38.5 |
| Example 67 | Flux of Example 30 | Solder powder 7 | 5.3 |

Test 6 (Examples 68 and 69)

1. Production of Flux and Solder Paste

Solder pastes were produced in the same manner as in Test 1 except that the respective fluxes were produced according to the formulations shown in Table 15 below.

2. Evaluation of Voids

Voids were evaluated under the same conditions as those for Comparative Example 1 except that the test bodies were produced using the respective solder pastes produced according to the formulations shown in Table 15 below. The void rate of each of Examples is shown in Table 15 below.

TABLE 15

| | Flux formulation (molar ratio) | | | |
|---|---|---|---|---|
| | Fatty acid | | Aliphatic primary | |
| | Nonanoic acid (95 mol %) | Oleic acid (5 mol %) | amine Hexylamine | Void rate (%) |
| Example 68 | 1 | 0.5 | | 10.3 |
| Example 69 | 1 | 1.5 | | 17.2 |

Test 7 (Example 70)

1. Production of Flux

A flux was produced in the same manner as in Test 1 except that the fatty acid and the aliphatic primary amine were used in combination according to Table 16 below, and the molar ratio of the aliphatic primary amine was according to Table 16 below.

2. Production of Solder Paste and Evaluation of Voids

A solder paste was produced in the same manner as in Test 1 except that the aforementioned flux was used. Voids were evaluated under the same conditions as those for Comparative Example 1 except that the test body was produced using the solder paste produced as described above. The void rate of Example 70 is shown in Table 16 below.

TABLE 16

| | Flux | | | |
|---|---|---|---|---|
| | Fatty acid (mol %) | Aliphatic primary amine (mol %) | | Void rate (%) |
| | Nonanoic acid | Hexylamine | Oleylamine | |
| Example 70 | 100 | 95 | 5 | 4.7 |

Test 8 (Examples 71 and 72)

1. Production of Flux

Fluxes were produced in the same manner as in Test 1 except that the fluxes had formulations according to Table 17 below.

2. Production of Solder Paste and Evaluation of Voids

A solder paste was produced in the same manner as in Test 1 except that the aforementioned flux was used. Voids were evaluated under the same conditions as those for Comparative Example 1 except that the test body was produced using the solder paste produced as described above. The void rate of each of Examples is shown in Table 17 below.

TABLE 17

| | Flux | | |
|---|---|---|---|
| | Fatty acid (mol %) | Aliphatic primary amine (mol %) | Void rate (%) |
| Example 71 | 4-methylnonanoic acid 100 | 2-ethylhexylamine 100 | 5.6 |
| Example 72 | 2-hexyldecanoic acid 100 | 2-ethylhexylamine 100 | 29.1 |

Test 9 (Example 73)

1. Production of Flux

A flux was produced in the same manner as in Test 1 except that the flux had a formulation according to Table 18 below.

2. Production of Solder Paste and Evaluation of Voids

A solder paste was produced in the same manner as in Test 1 except that the aforementioned flux was used, and a formulation was according to Table 19 below. Voids were evaluated under the same conditions as those for Comparative Example 1 except that the test body was produced using the solder paste produced as described above. The void rate of Example 73 is shown in Table 18 below.

TABLE 18

| | | Flux formulation | | | | | |
|---|---|---|---|---|---|---|---|
| | | Main component | | | | | |
| | | Fatty acid | | Aliphatic primary amine | Solvent | Thixotropic agent | Void rate |
| Ex. 73 | Used materials | Nonanoic acid (93 mol %) | Oleic acid (7 mol %) | Hexylamine (100 mol %) | Terpineol | Honey wax | 4.4% |
| | Formulation | 73.72 mass % | | | 15.57 mass % | 10.71 mass % | |

TABLE 19

|  | Flux of Example 73 | Solder powder 1 |
|---|---|---|
| Flux paste formulation (mass %) | 6.8 | 93.2 |

Test 10 (Comparative Example 2, Example 74)

1. Production of Flux and Solder Paste of Comparative Example 2

A solder paste was produced in the same manner as in Comparative Example 1 except that a flux of Comparative Example 1 was produced, and this flux and the solder powder 8 were used.

2. Production of Flux and Solder Paste of Example 74

A solder paste was produced in the same manner as in Test 1 except that a flux of Example 6 was produced, and this flux and solder powder 8 were used.

3. Evaluation of Voids (1) Production of Pseudo Substrate

A pseudo substrate was produced by printing each of the aforementioned solder pastes on an FR-4 resin substrate (that was subjected to an OSP treatment) to have a thickness of 120 μm and a mask opening rate of 100%.

(2) Heat Treatment

A PwTr chip was stacked on the obtained pseudo substrate to be subjected to a heat treatment under a nitrogen atmosphere with an oxygen concentration of 1,000 ppm using the solder reflow equipment (NIS-20-82-C, manufactured by EIGHTECH TECTRON Co., Ltd.). Thereby, a test body was obtained. The heat treatment was performed under the temperature conditions of raising the temperature from the start of heat treatment (normal temperature) to 180° C. at 1.5° C./second, and then maintaining at 180° C. for 100 seconds, which was thereafter followed by raising the temperature from 180° C. to 250° C. at 2.0° C./second, maintaining at 250° C. for 15 seconds, and then cooling from 250° C. to the normal temperature at 3.0° C./second (temperature profile 3).

(3) Calculation of Void Rate

The test body after the heat treatment was cut at the position where the PwTr chip was provided so that the cross-sectional surface was observed to calculate a void rate (airgap rate). Specifically, the area of void portions was calculated using the digital microscope KH-8700 manufactured by HIROX Co., Ltd. and the value was subtracted from the total area of the joint portion to calculate the void rate. The calculated void rate is shown in Table 20 below.

TABLE 20

|  | Flux | Solder powder | Void rate (%) |
|---|---|---|---|
| Com. Ex. 2 | Flux of Com. Ex. 1 | Solder powder 8 | 25 |
| Ex. 74 | Flux of Ex. 6 | Solder powder 8 | 0 |

<Summary>

When the void rate of Comparative Example 1 shown in Table 3 is compared with the void rates of Examples 1 to 73 shown in Tables 7, 8, and 10 to 18, it is found that Examples exhibit a lower void rate. That is, the void rate can be reduced by using the flux for solder paste that includes, as a main component, an organic component that includes a fatty acid and an aliphatic primary amine.

When Examples 1 to 3, 5 to 7 and 9 to 11 are compared with Examples 4, 8 and 12 to 24 in Tables 7 and 8 it is found that the void rate can be effectively reduced in Examples 1 to 3, 5 to 7 and 9 to 11. That is, the void rate can be more effectively reduced by using the one that has 10 or less carbon atoms in a main chain as the fatty acid, and using the one that has 8 or less carbon atoms in a main chain as the aliphatic primary amine.

When the void rate of Comparative Example 1 shown in Table 3 is compared with the void rates of Examples 25 to 55 shown in Tables 10 to 12, it is found that Examples exhibit a lower void rate. That is, the void rate can be reduced even when the fatty acid having a low boiling point (10 or less carbon atoms) and the fatty acid having a high boiling point (8 carbon atoms) are used in combination.

When the void rates of Examples 49 to 52 are compared with the void rates of Examples 53 to 55 in Table 12, it is found that Examples 49 to 52 exhibit a lower void rate. That is, the void rate can be more effectively reduced with the ratio of the molar numbers of the unsaturated fatty acid to the total molar numbers of the saturated fatty acid and the unsaturated fatty acid being 20 mol % or less.

When the void rate of Comparative Example 1 shown in Table 3 is compared with the void rates of Examples 56 to 60 shown in Table 13, it is found that Examples exhibit a lower void rate. That is, the void rate can be reduced by using the flux for solder paste according to the present invention while not being influenced by the content of the flux in the solder paste. Specifically, the void rate can be more effectively reduced with the content of the flux for solder paste being 5.5 mass % or more and 6 mass % or less.

When the void rate of Comparative Example 1 shown in Table 3 is compared with the void rates of Examples 61 to 67 shown in Table 14, it is found that Examples exhibit a lower void rate. That is, the void rate can be reduced by using the flux for solder paste according to the present invention while not being influenced by the type of the metal particles, the mixing ratio and the particle size range.

When the void rate of Comparative Example 1 shown in Table 3 is compared with the void rates of Examples 68 and 69 shown in Table 15, it is found that Example exhibit a lower void rate. That is, the void rate can be reduced by producing the flux for solder paste according to the present invention to include the fatty acid and the aliphatic primary amine with a molar ratio of 1:0.5 to 1:1.5.

When the void rate of Comparative Example 1 shown in Table 3 is compared with the void rate of Example 70 shown in Table 16, it is found that Example 70 exhibits a lower void rate. That is, the void rate can be reduced even when the aliphatic primary amine having a low boiling point (10 or less carbon atoms) and the aliphatic primary amine having a high boiling point (18 carbon atoms) are used in combination.

When the void rate of Comparative Example 1 shown in Table 3 is compared with the void rates of Examples 71 and 72 shown in Table 17, it is found that Examples exhibit a lower void rate. That is, the void rate can be reduced even when the flux for solder paste according to the present invention includes a branched chain type fatty acid and a branched chain type aliphatic primary amine.

When the void rate of Comparative Example 1 shown in Table 3 is compared with the void rate of Example 73 shown in Table 18, it is found that Example 73 exhibits a lower void rate. That is, the void rate can be reduced by producing the flux for solder paste according to the present invention, which includes a fatty acid and an aliphatic primary amine as a main component.

When the void rate of Comparative Example 2 is compared with the void rate of Example 74 in Table 20, it is found that Example 74 exhibits a lower void rate. That is, the void rate can be reduced by the flux for solder paste according to the present invention even when the solder paste is produced using the solder powder composed of Sn metal particles only.

The invention claimed is:

1. A solder paste comprising a solder paste flux and a solder powder, wherein
   the solder powder has an average particle size of 5 μm or more and 35 μm or less and comprises at least one of Sn metal particles composed of Sn or an Sn alloy and Cu metal particles composed of Cu or a Cu alloy,
   the solder paste flux comprises, as a main component, an organic component that includes a fatty acid and an aliphatic primary amine,
   the fatty acid and the aliphatic primary amine are in a form of a liquid at normal temperature,
   the fatty acid is at least one of a saturated fatty acid and an unsaturated fatty acid,
   the unsaturated fatty acid is at least one selected from the group consisting of oleic acid, linoleic acid, and linolenic acid, and
   a molar ratio between the fatty acid and the aliphatic primary amine is 1:0.5 to 1:1.5, wherein
   the solder paste further comprises the solder powder dispersed in the solder paste flux and the organic component including the fatty acid and the aliphatic primary amine is in the solder paste flux containing the dispersed solder powder.

2. The solder paste according to claim 1 comprising the organic component with a mass ratio of 70 mass % or more and 100 mass % or less based on the mass of the solder paste flux.

3. The solder paste according to claim 1, wherein the saturated fatty acid has 10 or less carbon atoms in a main chain and the unsaturated fatty acid has 18 or less carbon atoms.

4. The solder paste according to claim 1, wherein the fatty acid is composed of a saturated fatty acid and an unsaturated fatty acid, and the ratio of the molar numbers of the unsaturated fatty acid to the total molar numbers of the saturated fatty acid and the unsaturated fatty acid is 20 mol % or less.

5. The solder paste according to claim 1, wherein the aliphatic primary amine is at least one of a saturated aliphatic primary amine and an unsaturated aliphatic primary amine, the saturated aliphatic primary amine has 8 or less carbon atoms in a main chain, and the unsaturated aliphatic primary amine has 18 or less carbon atoms.

6. The solder paste according to claim 5, wherein the unsaturated aliphatic primary amine is oleylamine.

7. The solder paste according to claim 1, wherein a content of the solder paste flux in the solder paste is 5 mass % or more and 12 mass % or less.

* * * * *